United States Patent
Datta et al.

(10) Patent No.: US 6,228,246 B1
(45) Date of Patent: May 8, 2001

(54) REMOVAL OF METAL SKIN FROM A COPPER-INVAR-COPPER LAMINATE

(75) Inventors: Madhav Datta, Hillsboro, OR (US); Raymond T. Galasco, Vestal, NY (US); Lawrence P. Lehman; Roy H. Magnuson, both of Endicott, NY (US); Robin A. Susko, Owego, NY (US); Robert D. Topa, Binghamton, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/347,581

(22) Filed: Jul. 1, 1999

(51) Int. Cl.[7] .......................................... C25F 3/00
(52) U.S. Cl. .................... 205/646; 205/665; 205/671; 205/705; 204/229.5; 204/230.6; 204/242
(58) Field of Search ...................... 205/646, 665, 205/671, 705; 204/229.5, 230.6, 242

(56) References Cited

U.S. PATENT DOCUMENTS

| | | |
|---|---|---|
| 2,559,263 | 7/1951 | Smith . |
| 3,749,653 | 7/1973 | Tryzna et al. . |
| 3,866,398 | 2/1975 | Vernon, Jr. et al. . |
| 4,434,022 | 2/1984 | Kamada et al. . |
| 4,482,445 | * 11/1984 | Fjelstad ................................ 205/646 |

(List continued on next page.)

FOREIGN PATENT DOCUMENTS

| | | |
|---|---|---|
| 07106482 | of 1985 | (JP) . |
| 08111485 | of 1996 | (JP) . |

OTHER PUBLICATIONS

Lo et al., "Ultrasonic Chemical Method of Cleaning Blind Holes in a Printed–Circuit Board", IBM Technical Disclosure Bulletin, vol. 20, No. 3, p. 962, Aug. 1977.

Frankeny et al., "High–Density Electrical Substrate Manufacturing Process", vol. 34, No. 6, pp. 167–170, Nov. 1991.

"High Performance Carrier Technology: Materials And Fabrication", by Light et al, 1993 International Electronics Packaging Conference, San Diego, California, vol. One.*

"High Performance Carrier Technology", by Heck et al, 1993 International Electronics Packaging Conference, San Diego, California, vol. One.*

"Process Considerations in the Fabrication of Teflon Printed Circuit Boards", by Light et al, 1994 Proceedings, 44 Electronic Components & Technology Conference, 5/94.

*Primary Examiner*—Arun S. Phasge
(74) *Attorney, Agent, or Firm*—Schmeiser, Olsen & Watts; Lawrence R. Fraley

(57) ABSTRACT

A method of removing a metal skin from a through-hole surface of a copper-Invar-copper (CIC) laminate without causing differential etchback of the laminate. The metal skin includes debris deposited on the through-hole surface as the through hole is being formed by laser or mechanical drilling of a substrate that includes the laminate as an inner plane. Removing the metal skin combines electrochemical polishing (ECP) with ultrasonics. ECP dissolves the metal skin in an acid solution, while ultrasonics agitates and circulates the acid solution to sweep the metal skin out of the through hole. ECP is activated when a pulse power supply is turned on and generates a periodic voltage pulse from a pulse power supply whose positive terminal is coupled to the laminate and whose negative terminal is coupled to a conductive cathode. After the metal skin is removed, the laminate is differentially etched such that the copper is etched at a faster rate than the Invar. To prevent the differential etching, a copper layer is formed on a surface of the substrate with an electrical resistance $R_1$ between the copper layer and the positive terminal of the pulse power supply. Additionally, an electrical resistance $R_2$ is formed between the laminate and the positive terminal of the pulse power supply. Adjustment of $R_1$ and $R_2$ controls the relative etch rates of the copper and the Invar.

45 Claims, 8 Drawing Sheets

U.S. PATENT DOCUMENTS

| | | |
|---|---|---|
| 5,028,303 | 7/1991 | Kuwabara et al. . |
| 5,152,878 | 10/1992 | Datta et al. . |
| 5,352,325 | 10/1994 | Kato . |
| 5,363,553 | 11/1994 | Edwards et al. . |
| 5,374,338 | 12/1994 | Boyko et al. . |
| 5,472,735 | 12/1995 | Boyko et al. . |
| 5,595,668 | 1/1997 | Madden, Jr. et al. . |
| 5,639,389 | 6/1997 | Schmidt et al. . |

* cited by examiner

US 6,228,246 B1

REMOVAL OF METAL SKIN FROM A COPPER-INVAR-COPPER LAMINATE

BACKGROUND OF THE INVENTION

1. Technical Field

The present invention relates to a method of removing a metal skin from a through-hole surface of a copper-Invar-copper (CIC) laminate without causing differential etchback of the laminate.

2. Related Art

A copper-Invar-copper (CIC) laminate is commonly included in electronic packages. For example, a CIC laminate may be present within a dielectric substrate. Exterior surfaces of the substrate may be circuitized such that a plated through hole (PTH) passes through the CIC laminate and electrically couples the surface circuitizations. During formation of the preceding electrical structure, laser or mechanical drilling of a through hole that passes through the CIC laminate generates debris along the drilling path. A portion of the debris forms a porous "metal skin" over a CIC surface within the through hole. The predominant constituents of the metal skin are metallic debris derived from the CIC laminate, such as copper, iron, and nickel. The metal skin may also include a relatively small amount of dielectric debris derived from the dielectric substrate.

The metal skin is problematic because its porosity allows processing chemicals, such as acid solutions, to penetrate the pores of the metal skin and become trapped between the metal skin and the CIC surface covered by the metal skin. Subsequent copper plating of the through hole to form the PTH may seal the acid solutions or other chemicals between the metal skin and the CIC surface covered by the metal skin. The sealing of acid solution is a reliability concern. For example, a pocket void may be generated within the Invar layer of the CIC laminate due to formation of a galvanic cell comprising a CIC copper layer, the CIC Invar, and the acid solution. Noting that Invar is an alloy that includes iron (Fe) and nickel (Fe), the galvanic cell causes oxidiation of the Invar and consequent formation of iron and/or nickel ions. Such ions dissolve in the acid solution and are thus permanently removed from the Invar, thereby creating a pocket void in the Invar layer. Such pocket voids impair the structural integrity of the overlaying copper plating and may subject the copper plating to mechanical and thermal stresses.

Another adverse aspect of the metal skin is that the metal skin is an unnecessary interface between the copper plating and the CIC surface covered by the copper plating. This extra interface could fail, mechanically or thermally, even in the absence of pocket voids.

Fabricating an electronic device having a CIC laminate with a drilled through hole may include removing the metal skin that covers the through hole and etch-cleaning the CIC surface beneath the metal skin. Thus, a method is needed for removing the metal skin and etching the underlying CIC surface such that the depth of CIC material etched away is about the same for the copper and Invar layers of the CIC laminate.

SUMMARY OF THE INVENTION

The present invention provides a method for removing a metal skin from a copper-Invar-copper (CIC) laminate, comprising the steps of:

providing a pulse power supply, a conductive cathode, an acid solution, and a dielectric substrate including:
  the CIC laminate having an Invar layer sandwiched between a first copper layer and a second copper layer;
  a through hole passing through the CIC laminate; and
  the metal skin on a through-hole surface of the CIC laminate;

forming an electrochemical structure, including:
  immersing the transducer in the acid solution;
  electrically coupling the transducer to the power supply;
  immersing the conductive cathode in the acid solution;
  electrically coupling the conductive cathode to a negative terminal of the pulse power supply;
  immersing the CIC laminate in the acid solution;
  electrically coupling the CIC laminate to a positive terminal of the pulse power supply;
  turning on the pulse power supply and generating a periodic voltage, wherein a period of the periodic voltage includes a pulse voltage for a first time interval followed by a zero voltage for a second time interval; and dissolving away the metal skin.

The present invention has the advantage of removing the metal skin and etching the underlying CIC surface such that the depth of CIC material etched away is about the same for the copper and Invar layers of the CIC laminate.

The method of the present invention for removing the metal skin is insensitive to the diameter or aspect ratio of the through hole. Thus the method of the present invention has the advantage of being applicable to through holes having a small diameter such as 2 mils or less.

The present invention has the advantage of etching an exposed surface of a CIC laminate in a manner that controls the relative etch rates of exposed copper and Invar surfaces of the CIC laminate.

DETAILED DESCRIPTION OF THE INVENTION

Figure 1:
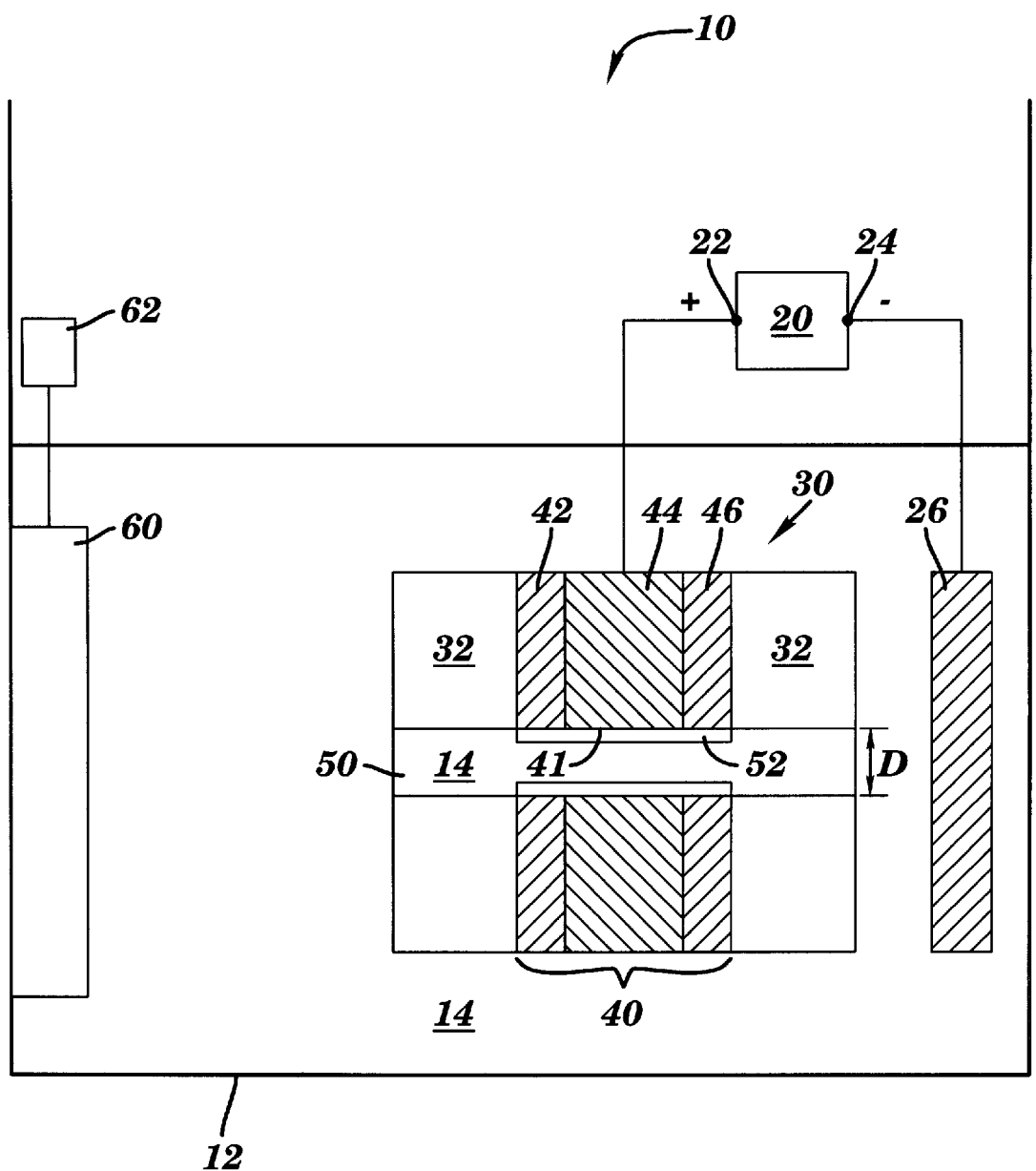
FIG. 1 depicts a front cross-sectional view of an electrochemical structure, including an acid solution, a pulse power supply, a substrate, a conductive cathode, and a transducer, in accordance with a first preferred embodiment of the present invention.

FIG. 1 depicts a front cross-sectional view of an electrochemical structure, in accordance with a first preferred embodiment of the present invention. FIG. 1 shows a tank 12 holding an acid solution 14, a pulse power supply 20, a substrate 30 immersed in the acid solution 14, a conductive cathode 26 immersed in the acid solution 14, and a transducer 60 immersed in the acid solution 14 and coupled to a power supply 62. The substrate 30 includes dielectric material 32, an internal copper-Invar-copper (CIC) laminate 40, and a through hole 50 passing through the CIC laminate 40. The CIC laminate 40 includes an Invar layer 44 sandwiched between a first copper layer 42 and a second copper layer 46. Invar is an alloy of iron (Fe) and nickel (Ni) with nickel constituting about 36% of the alloy. The CIC laminate 40 is electrically coupled to a positive terminal 22 of the pulse power supply 20. The conductive cathode 26 is electrically coupled to a negative terminal 24 of the pulse power supply 20. A metal skin 52 is positioned on a through-hole surface 41 of the CIC laminate 40. The metal skin 52 is the result of a process such as laser or mechanical drilling, as described in the "Related Arts." section. The present invention is directed to removing the metal skin 52 from the through hole 50.

The method of the present invention for removing the metal skin 52 combines electrochemical polishing (ECP) with ultrasonics. ECP dissolves the metal skin 52 in the acid solution 14, while ultrasonics agitates and circulates the acid solution 14 to sweep the metal skin 52 out of the through hole 50.

Figure 2:
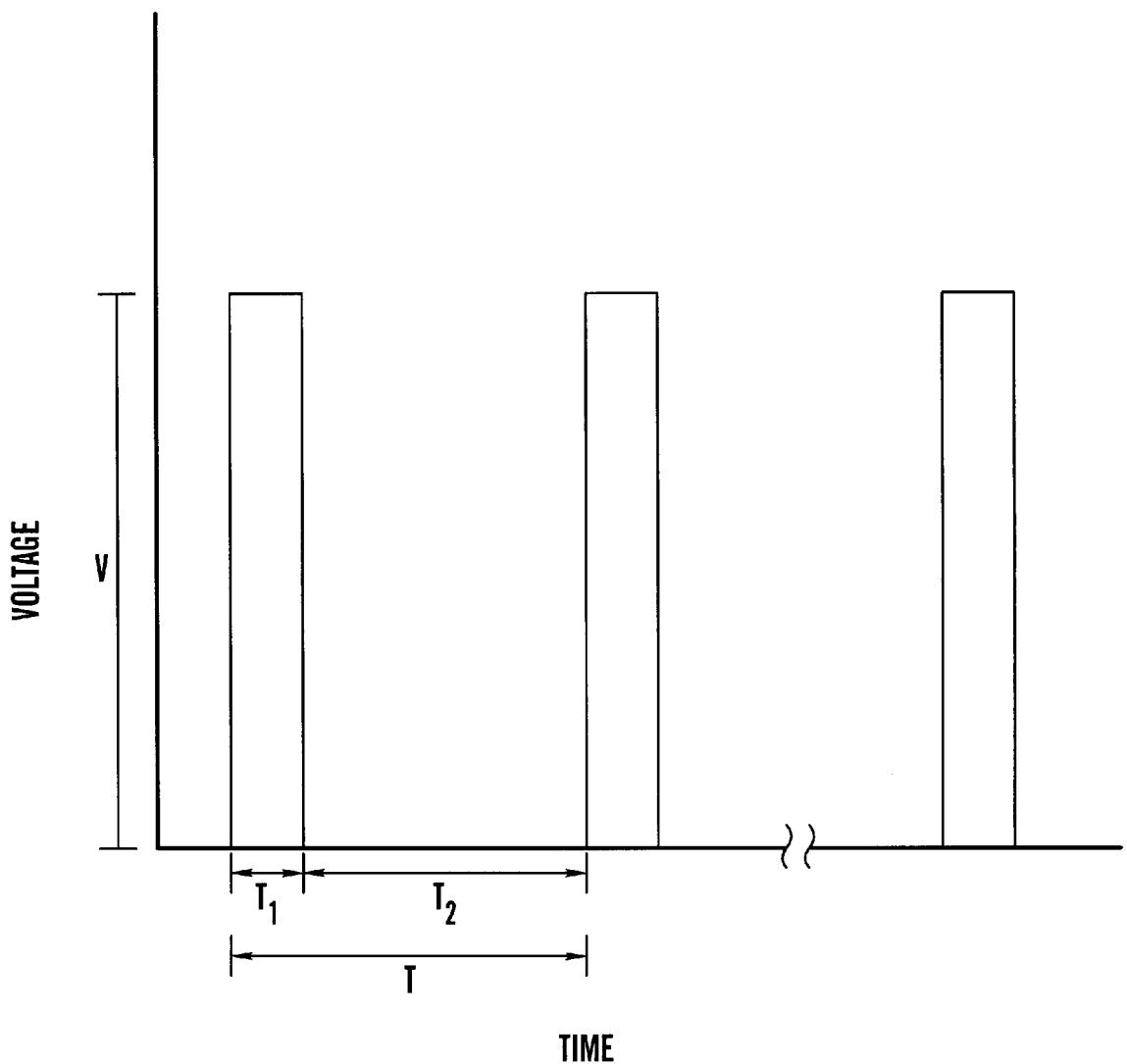
FIG. 2 depicts the form of a periodic voltage generated by the pulse power supply of FIG. 1.

ECP is activated when the pulse power supply 20 is turned on and generates a periodic voltage. As shown in FIG. 2, a cycle of period T of the periodic voltage includes a pulse voltage of height V for a time interval $T_1$, followed by a "zero voltage" for a time interval $T_2$. A "zero voltage" is a voltage of zero volts or a minimal voltage such as would be associated with a very small current. V should be between about 1 volts and about 10 volts. $T_1$ should be between about 5 milliseconds and about 20 milliseconds. $T_2$ should be between about 20 milliseconds and about 200 milliseconds. The pulse power supply 20 in FIG. 1 should be on for at least as much time ($T_{min}$) as is necessary to remove the metal skin 52 from the through hole 50. In current practice with the metal skin thickness between about 0.25 microns and about 5 microns, $T_{min}$ is typically between 1 minutes and about 10 minutes. The substrate 30 should preferably be removed from the acid solution 14 when the time $T_{min}$ has elapsed, or shortly thereafter. After the time $T_{min}$ has elapsed, the CIC laminate 40 is subject to being etched if left in the acid solution 14 with the pulse power supply 20 on, as will be discussed infra. Thus, $T_{min}$ is an optimum processing time.

The electrochemistry of ECP involves ionic processes at the metal skin 52 and at the conductive cathode 26. The metal skin 52, which contains debris such as copper, iron, and nickel, is oxidized to form ionic species from the copper (e.g., $Cu^{++}$), iron (e.g., $Fe^{++}$, $Fe^{+++}$), and nickel (e.g., $Ni^{++}$). The ionic species thus formed dissolve in the acid solution 14 and are transported out of the through hole 50 by the circulating acid solution 14. The preceding oxidation reactions generate electrons which travel through the circuitry in FIG. 1, including through the pulse power supply 20, to the conductive cathode 26. At the conductive cathode 26, the transported electrons reductively combine with hydrogen ions ($H^+$) to form hydrogen gas, as a consequence of the negatively polarized pulse voltage at the conductive cathode 26. The hydrogen ions are supplied by the acid solution 14. Other reductions may occur, such as a reduction of copper ions to copper metal if the acid solution 14 includes copper.

The acid solution 14 could include any acid that dissolves the metal skin 52 under anodic bias. A suitable acid solution is phosphoric acid with a preferred concentration between about 38% and about 55% at a temperature between about 21° C. and about 35° C. The conductive cathode 26 may be a plate, a screen, or have any other geometrical shape. The conductive cathode 26 should include a metal that is preferably inert to the acid solution 14, such as stainless steel or platinized titanium with a phosphoric acid solution. If the conductive cathode 26 dissolves in the acid solution 14, the dissolving should be at a sufficiently low rate such that the conductive cathode 26 has enough remaining structure to operate as intended while the pulse power supply 20 is turned on.

When the power supply 62 is turned on, the transducer 60 generates an ultrasonic power at a frequency. The ultrasonic power should be between about 1 kw and about 10 kw. The frequency should be between about 45 Khz and about 75 Khz. The ultrasonics serves to remove ionic metal skin debris by agitating and circulating the acid solution 14. Inasmuch as ionic metal skin debris is generated during the short time interval $T_1$ (see FIG. 2) when the pulse voltage height V is operative, the longer subsequent time interval $T_2$ (see FIG. 2) allows time for the ultrasonics to agitate and circulate the acid solution 14 to eliminate high concentrations of metal skin debris. It is preferred, but not required, to turn on the power supply 62 slightly before (e.g., about 10 seconds) the pulse power supply 20 is turned on, in order to establish an acid solution 14 circulation pattern in the through hole 50 before initiating ionization of the metal skin 52. For operating the transducer with maximum effectiveness, the conductive cathode 26 should not be positioned in the direct flow path between the transducer 60 and the through hole 50.

Combining the pulse voltage with ultrasonics is very effective for metal skin removal even for through holes of high aspect ratio or small diameter, such as for through holes having a diameter (D) of 2 mils or less as may be formed, for example, by laser drilling. This method is of course also applicable to large through holes such as mechanically-drilled through holes having a diameter of 8 to 14 mils. Thus, the ability of the method to effectively remove metal skins is insensitive to through-hole diameter.

As stated supra, ultrasonics combined with ECP is highly effective for removing metal skin. Nonetheless, ECP can be used without accompanying ultrasonics to remove metal skin. The time for metal skin removal by ECP without ultrasonics is a factor of about 3 to about 10 times longer than the time for metal skin removal by ECP with ultrasonics.

It is preferred to wet and clean the through hole 50 before implementing the ECP. This can be accomplished, inter alia, by the following three-step process. First, the through hole 50 is rinsed with deionized water under ultrasonic agitation for about 1 minute, between about 45 and about 75 Khz, in order to wet the through-hole surface 41 of the CIC laminate 40. Second, the through hole 50 is washed with an acidic solution for about ½ minute, such as with a methane sulfonic acid solution, to remove copper oxides and to clean the Invar surface. Third, the first step of rinsing with deionized water is repeated. It is likewise preferred to repeat the preceding three-step process for wetting and cleaning the through hole 50 after implementing the ECP.

Figure 3:
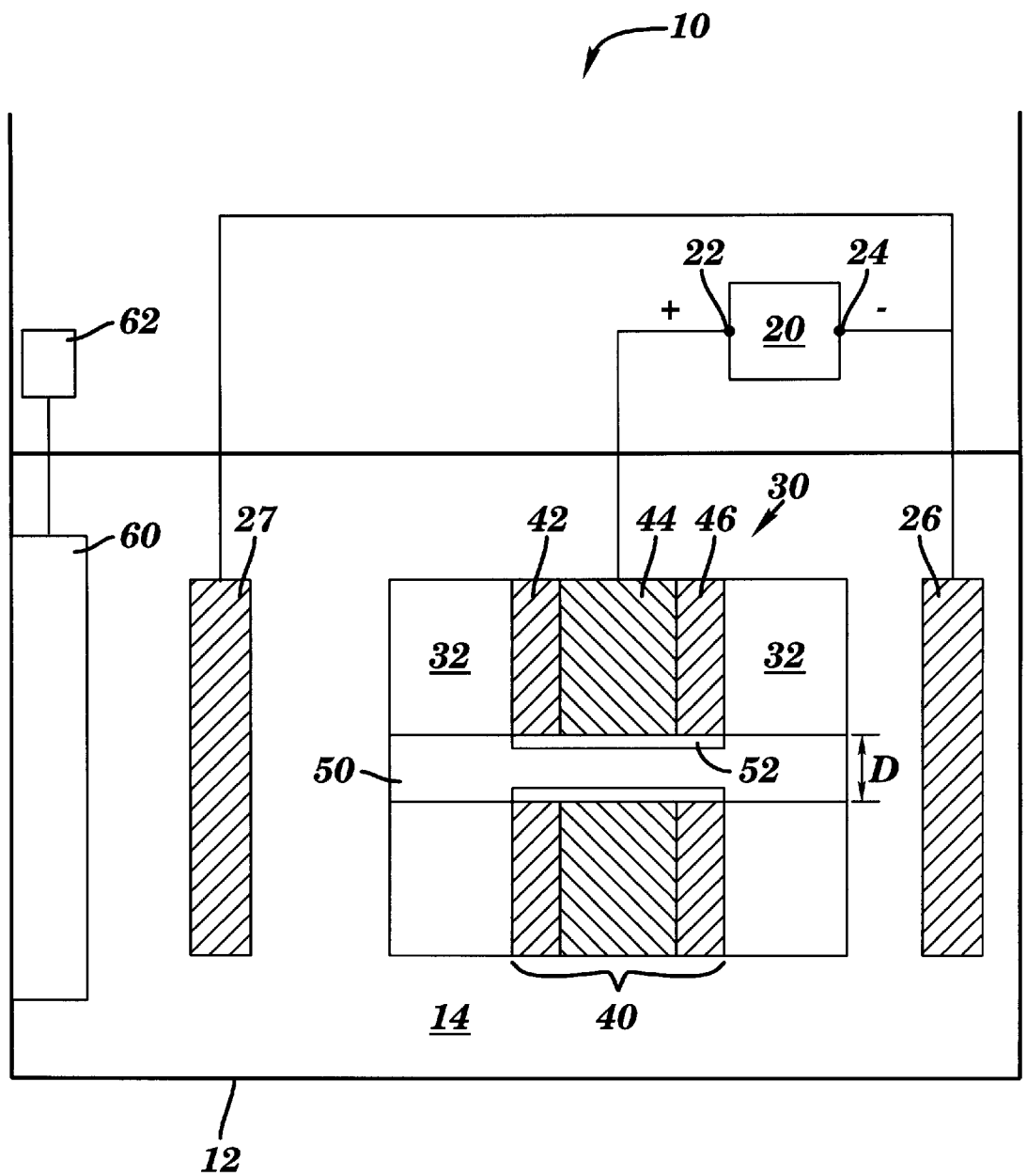
FIG. 3 depicts FIG. 1 after a second conductive cathode has been added, in accordance with a second preferred embodiment of the present invention.

FIG. 3 depicts FIG. 1 after a second conductive cathode 27 has been added and electrically coupled to the negative terminal 24 of the pulse power supply 20, in accordance with a second preferred embodiment of the present invention. Use of the second conductive cathode 27, if suitably positioned relative to the position of the conductive cathode 26 in relation to the circumference of the metal skin 52, removes the metal film 52 in a more spatially uniform manner than if only the conductive cathode 26 is used.

Figure 4:
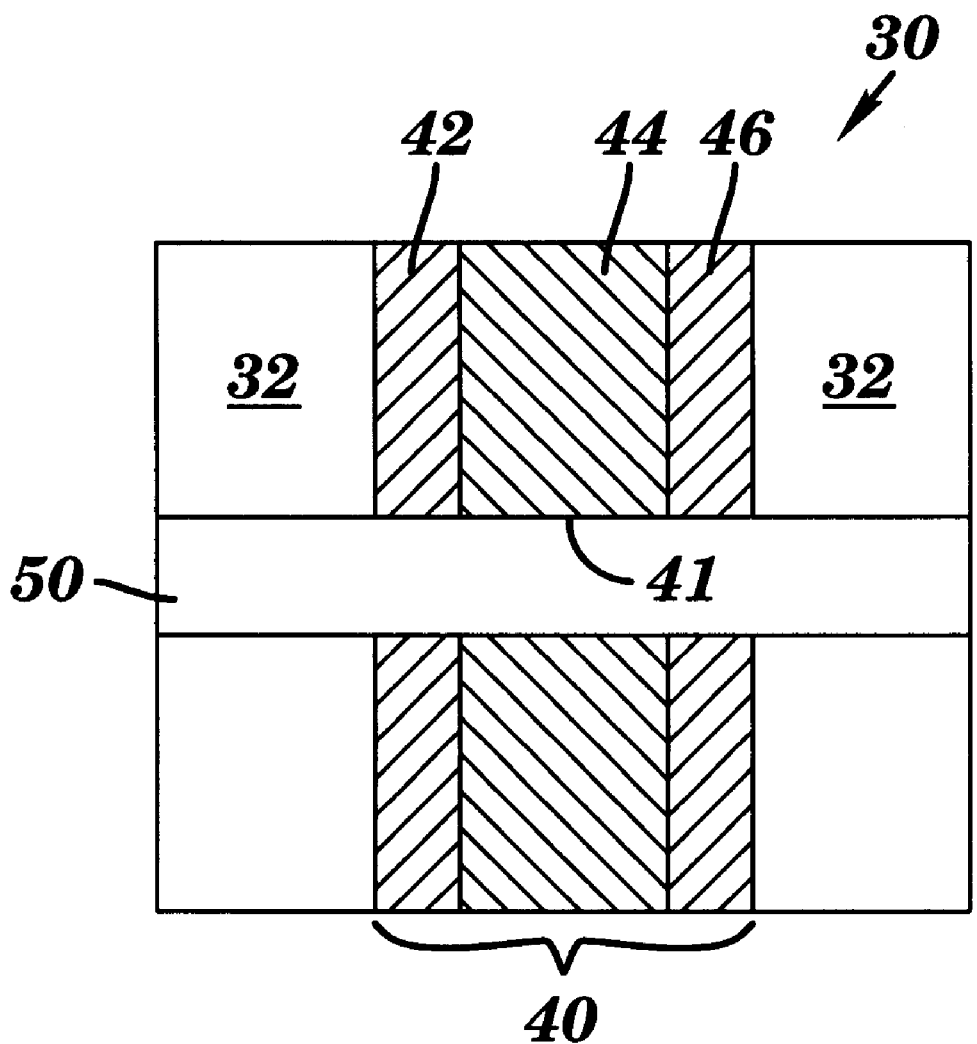
FIG. 4 depicts the substrate of FIG. 1 upon removal of the substrate from the acid solution when an optimum processing time has elapsed.
Figure 5:
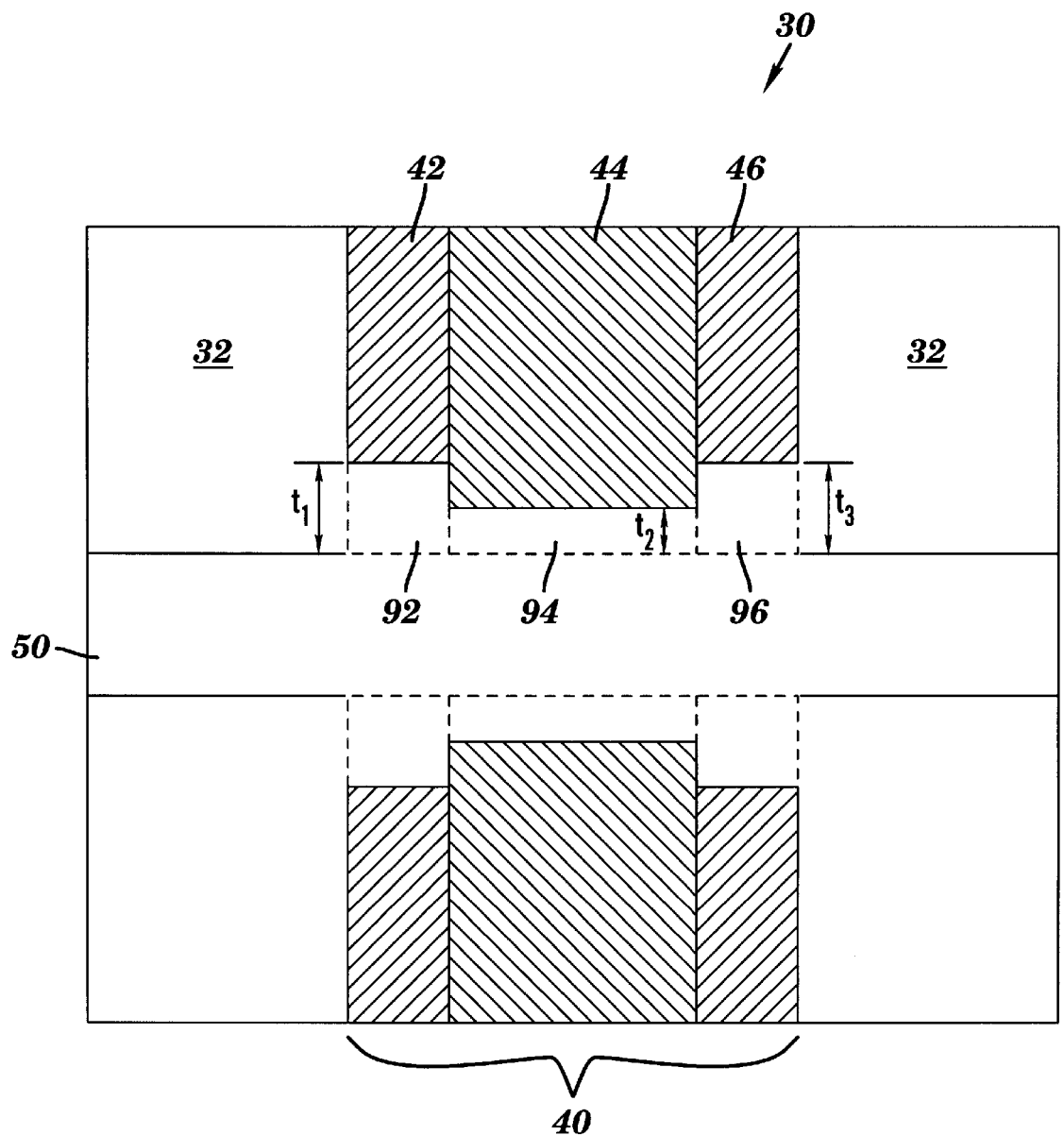
FIG. 5 depicts FIG. 4 showing an etch structure formed as a result of processing for a time longer the optimum processing time.

FIG. 4 illustrates the substrate 30 of FIG. 1 upon removal of the substrate 30 from the acid solution 14 when the optimum processing time $T_{min}$ has elapsed; i.e., when the metal skin 52 has been removed and before any etching of the CIC laminate 40 has occurred. FIG. 4 shows that the metal skin 52 (see FIG. 1) has been eliminated by the combination of ECP and ultrasonics. In practice, however, it is difficult to estimate $T_{min}$ with perfect precision. Thus, if the substrate 30 is processed for a time greater than $T_{min}$, the CIC laminate 40 is subject to etching, as showing in FIG. 5. The same ECP process that previously dissolved the metal skin 52, will etch away volumes 92, 94, and 96, with associated etched thicknesses $t_1$, $t_2$, and $t_3$, for the first copper layer 42, the Invar layer 44, and the second copper layer 46, respectively. In general, $t_1$, and $t_3$ will be approximately equal, but may not be exactly equal due to lack of perfect symmetry relative to the spatial environments seen by the first copper layer 42 and the second copper layer 46. In FIG. 5, $t_1$, and $t_3$ are approximately equal to each other and each is greater than $t_2$. Applicants have observed a difference between $t_1$, and $t_2$, or between $t_3$ and $t_2$, as high as 25 microns. This differential etchback of the copper versus the Invar may make it difficult or impossible to subsequently plate the through hole 50 with copper, or result in a mechanically or thermally weak location even if copper plating can be accomplished.

Figure 6:
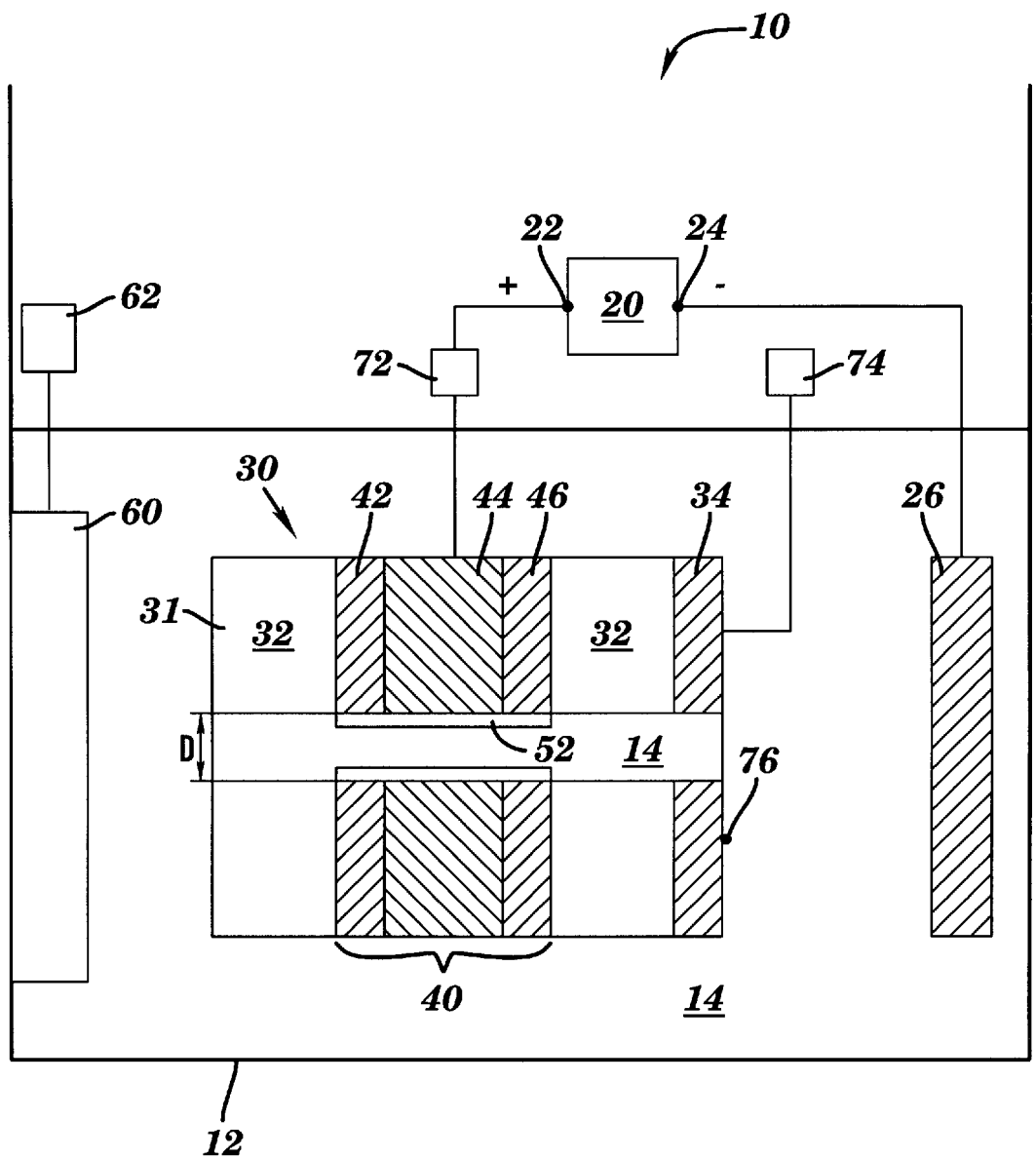
FIG. 6 depicts FIG. 1 with a substrate-coupled copper anode added for eliminating differential etchback, in accordance with a third preferred embodiment of the present invention.

The electrochemical structure of FIG. 6 is directed to eliminating the aforementioned differential etchback, in accordance with a third preferred embodiment of the present invention. FIG. 6 illustrates FIG. 1 with an addition of a copper anode 34 electrically coupled to the positive terminal 22 of the pulse power supply 20. The copper anode 34 has the form of a copper layer, such as a copper plating or a copper foil, on a surface of the substrate 30. The electrical coupling between the copper anode 34 and the pulse power supply 20 includes an electrical resistance 74 ($R_1$) such as a resistor, a wire, or an electrical contact. Additionally, the electrical coupling between the CIC laminate 40 and the pulse power supply 20 includes an electrical resistance 72 ($R_2$) such as a resistor, a wire, or an electrical contact. The method for eliminating differential etchback involves adjusting $R_1$ and $R_2$. The electrochemical structure of FIG. 6 may be used for removing the metal skin 52 with control of differential etchback. Alternatively, FIG. 6 may be used for controlling differential etchback even in the absence of the metal skin 52.

Figure 7:
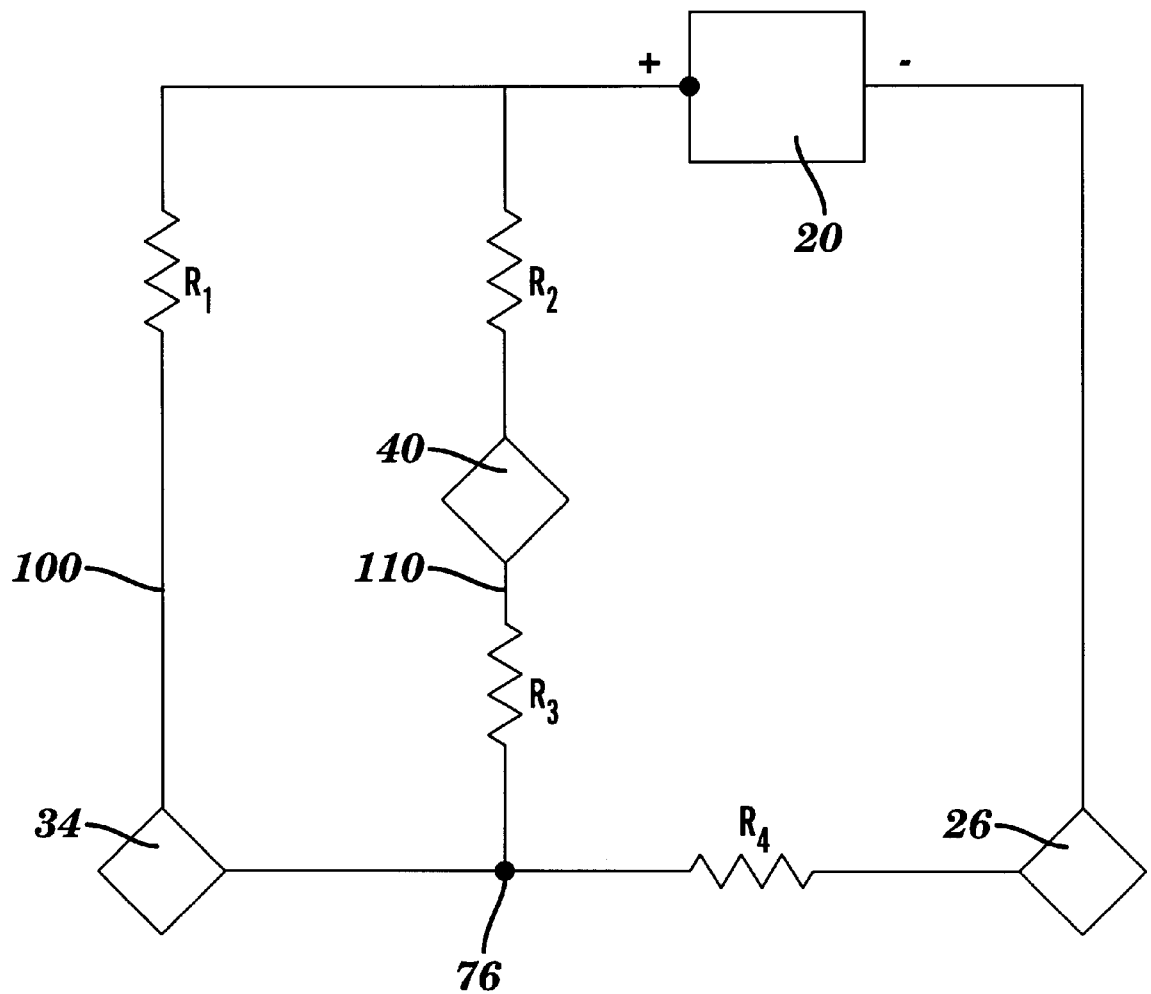
FIG. 7 depicts an electrical circuit model of FIG. 6.

FIG. 7 illustrates a simplified electrical circuit model of FIG. 6. $R_1$ and $R_2$ are represented in FIG. 7. Node 76 in FIG. 7, which is also shown in FIG. 6, represents a point at the interface between the copper anode 34 and the acid solution 14. FIG. 7 additionally shows resistances $R_3$ and $R_4$. $R_3$ is the electrolytic resistance of the acid solution 14 inside the through hole 50. $R_4$ is the electrolytic resistance of the acid solution 14 between the node 76 and the conductive cathode 26. As a practical matter, resistances $R_3$ and $R_4$ are fixed for a given geometry and acid solution 14, while resistances $R_1$ and $R_2$ may be varied is such a manner as to eliminate the differential etchback. Inasmuch as the etching of the copper increases as the current through the copper increases, the idea of this method is to control the current through the first copper layer 42 and the second copper layer 46. This is accomplished by adjusting the current split between branches 100 and 110 in FIG. 7. In effect, lowering the resistance $R_1$ increases the current through the copper anode 34 while decreasing the current in the first copper layer 42 and the second copper layer 46. Since $R_3$ and $R_4$ are application dependent, it is not possible to specify specific numerical values of $R_1$ and $R_2$ for controlling the differential etchback. To use the present invention to control differential etchback, one skilled in the art could empirically determine suitable values of $R_1$ and $R_2$, without undue experimentation. For example, Applicants performed a simple parametric experiment in which the etch thickness of the copper and Invar in the CIC laminate 40 were measured as a function of $R_1$ and $R_2$. The results are shown in the following table.

| Variable | Units | Data 1 | Data 2 | Data 3 | Data 4 |
|---|---|---|---|---|---|
| Lead resistance to CIC anode ($R_2$) | mohms | 10 | 1 | 1 | 1 |
| Lead resistance to copper anode ($R_1$) | mohms | 1 | 1 | 5 | 20 |
| Copper etch thickness ($t_1$ or $t_3$) | microns | 0 | 0 | 20 | 20 |
| Invar etch thickness ($t_2$) | microns | 14 | 15 | 15 | 15 |

For the preceding table, $R_3$ was estimated as about 50 MΩ. The characteristics of the periodic voltage of the pulse power supply 20 are: $T_1$=10 msec (pulse on), $T_2$=99.9 msec (pulse off), V=2.5 volts (pulse voltage height), total time=2.5 min. As stated supra, the specific results in the preceding table are not generalizable. Nonetheless, the preceding table illustrates the ease with which one skilled in the art may determine values of $R_1$ and $R_2$ to control differential etchback. Note that in addition to eliminating differential etchback, this method may be used to purposefully generate a particular differential etchback, wherein the copper is etched back more than the Invar, or wherein the Invar is etched back more than the copper.

Figure 8:
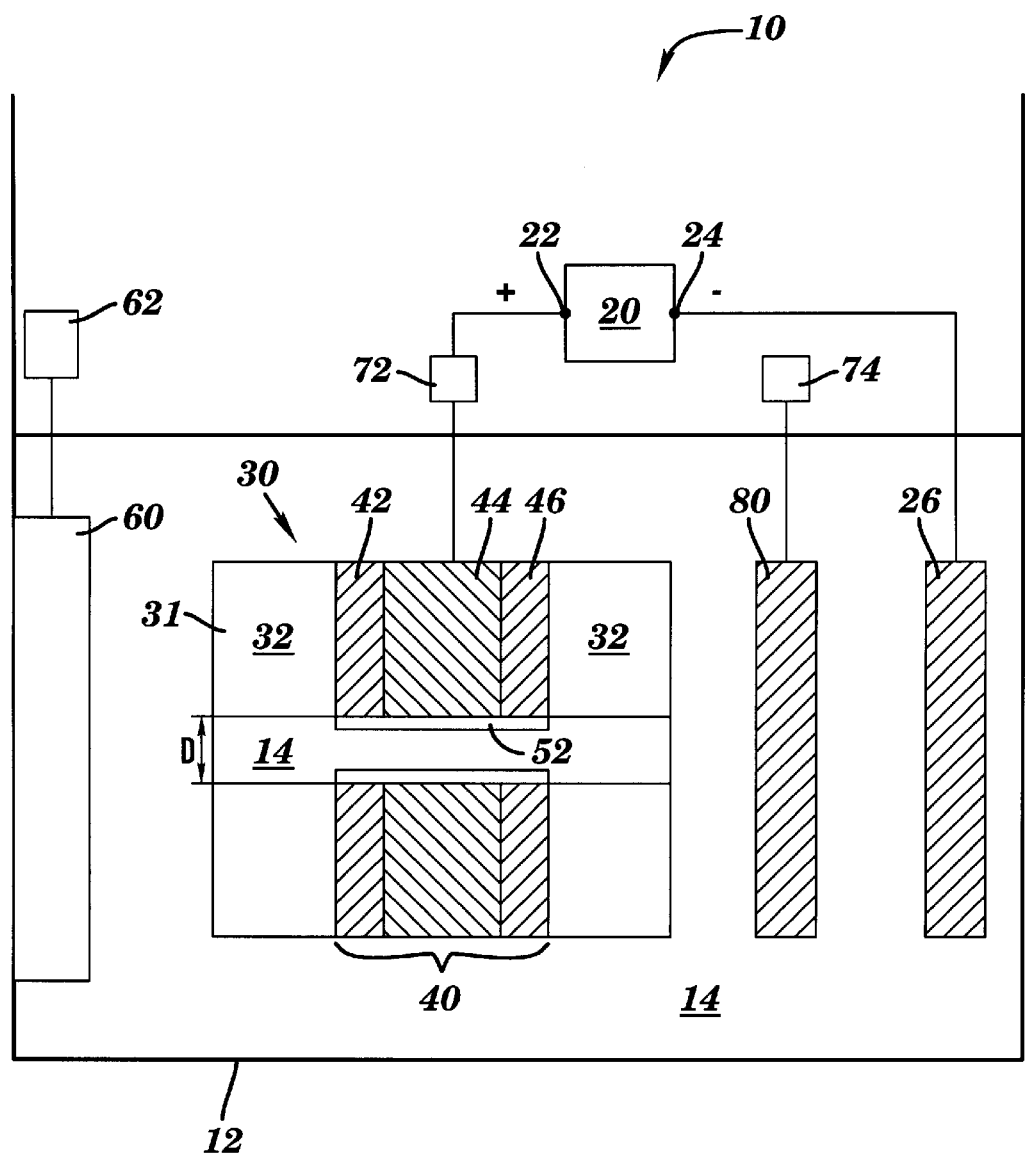
FIG. 8 depicts FIG. 1 after a substrate-decoupled copper anode is added for eliminating differential etchback, in accordance with a fourth preferred embodiment of the present invention.

FIG. 8 illustrates FIG. 1 with an addition of a copper anode 80 electrically coupled to the positive terminal 22 of the pulse power supply 20, and immersed in the acid solution 14, in accordance with a fourth preferred embodiment of the present invention. It is preferred that the copper anode 80 have a porous structure such as a screen. The electrochemical configuration of FIG. 8 is the same as that of FIG. 6 with the copper anode 80 in FIG. 8 having the same role as the copper anode 34 in FIG. 6. There is no difference in the analyses of FIGS. 6 and 8.

As a result of the processes of the present invention, particulate matter such as undissolved copper may build up in the acid solution 14. Accordingly, an external loop having a pump and a filter may be used to circulate the acid solution 14 and filter out such particulate matter.

Although the skin removal and controlled differential etching processes of the of the present invention were described supra for a CIC laminate, these processes are also applicable to structures other than CIC laminates.

The skin removal process of the present invention is generally applicable to the following relevant structures: a CIC laminate, a copper-Invar laminate, a laminate comprising a copper layer interfaced with a layer of a nickel-iron alloy (i.e., an alloy that includes nickel and iron), and a layer of a nickel-iron alloy. Metal skin derived from each of the preceding relevant structures includes some or all of copper, nickel, and iron, and the skin removal process described supra is specifically directed to dissolving ionic species of copper, nickel, and iron. Thus, each of the preceding relevant structures are within the scope of the skin removal process of the present invention, and may substitute for the CIC laminate 40 in FIGS. 1, 3, and 4.

The controlled differential etching process of the present invention is applicable to any etchable laminate comprising two metallic layers in contact. An etchable laminate must satisfy the condition that each of the two metallic layers are etchable in an acid solution under application of a periodic pulsed voltage. A metallic layer includes a metal or a metal alloy. An example of an etchable laminate is a laminate comprising a layer of copper and a contacting layer of a tin-lead alloy. An etchable laminate may substitute for the CIC laminate 40 in FIGS. 6 and 8. Implementation in accordance with the resistance structure of FIG. 6 or FIG. 8, as modeled in FIG. 7, includes two essential steps. First, the metallic layer that etches at the faster rate must be determined. Second, the copper anode 34 of FIG. 6, or the copper anode 80 of FIG. 8, must include (instead of copper) the same metal or metal alloy that is comprised by the metallic layer that etches at the faster rate. Note that for the CIC laminate described supra, copper etches at a faster rate than Invar in a phosphoric acid solution. Accordingly, the copper anode 34 of FIG. 6 and the copper anode 80 of FIG. 8 each contain copper rather than Invar in conjunction with the CIC laminate 40. The etchable laminate, which may substitute for the CIC laminate 40 in FIGS. 6 and 8, may be positioned on a surface 31 of the substrate 30. Additionally, the etchable laminate may also exist as a stand-alone structure, such as the substrate 30 wherein the dielectric material 32 is absent.

While preferred and particular embodiments of the present invention have been described here for purposes of illustration, many modifications and changes will become apparent to those skilled in the art. Accordingly, the appended claims are intended to encompass all such modifications and changes as fall within the true spirit and scope of this invention.

We claim:

1. A method for removing a metal skin from a copper-Invar-copper (CIC) laminate, comprising the steps of:
   providing a pulse power supply, a conductive cathode, an acid solution, and a dielectric substrate including:
      the CIC laminate having an Invar layer sandwiched between a first copper layer and a second copper layer;
      a through hole passing through the CIC laminate; and
      the metal skin on a through-hole surface of the CIC laminate;
   forming an electrochemical structure, including:
      immersing the transducer in the acid solution;
      electrically coupling the transducer to the power supply;
      immersing the conductive cathode in the acid solution;
      electrically coupling the conductive cathode to a negative terminal of the pulse power supply;
      immersing the CIC laminate in the acid solution;
      electrically coupling the CIC laminate to a positive terminal of the pulse power supply;
      turning on the pulse power supply and generating a periodic voltage, wherein a period of the periodic voltage includes a pulse voltage for a first time interval followed by a zero voltage for a second time interval; and
   dissolving away the metal skin.

2. The method of claim 1, further providing a transducer and a power supply for the transducer, wherein the step of forming an electrochemical structure further includes turning on the power supply, and wherein the transducer generates an ultrasonic power having a frequency.

3. The method of claim 2, wherein the ultrasonic power is between about 1 kw and about 10 kw, and wherein the frequency is between about 45 KHz and about 75 KHz.

4. The method of claim 1, further comprising prior to immersing the CIC laminate in the acid solution, wetting and cleaning a bounding surface of the through hole.

5. The method of claim 4, wherein the wetting includes rinsing the bounding surface with deionized water under ultrasonic agitation, and wherein leaning includes washing the substrate with an acidic solution.

6. The method of claim 5, wherein the acidic solution is methane sulfonic acid.

7. The method of claim 1, further comprising turning off the pulse power supply and, after the step of removing the CIC as laminate from the acid solution, wetting and cleaning a bounding surface of the through hole.

8. The method of claim 7, wherein the wetting includes rinsing the bounding surface with deionized water under ultrasonic agitation, and wherein the cleaning includes washing the substrate with an acidic solution.

9. The method of claim 8, wherein the acidic solution is methane sulfonic acid.

10. The method of claim 1 wherein a diameter of the through hole is not greater than about 2 mils.

11. The method of claim 1, wherein the acid solution includes phosphoric acid.

12. The method of claim 11, wherein a concentration of the phosphoric acid is between about 38% and about 55%.

13. The method of claim 1, wherein a temperature of the acid solution is between about 21° C. and about 35° C.

14. The method of claim 1, wherein the conductive cathode includes stainless steel.

15. The method of claim 1, wherein the pulse voltage is between about 1 volt and about 10 volts, wherein the first time interval is between about 5 milliseconds and about 20 milliseconds, and wherein the second time interval is between about 20 milliseconds and about 200 milliseconds.

16. The method of claim 1, further providing a second conductive cathode, wherein the step of forming an electrochemical structure further includes:
   immersing the second conductive cathode in the acid solution; and
   electrically coupling the second conductive cathode to the negative terminal of the pulse power supply.

17. The method of claim 1, further comprising after the dissolving away step:
   etching away a thickness ($t_1$) of the first copper layer;
   etching away a thickness ($t_2$) of the second copper layer; and
   etching away a thickness ($t_3$) of the Invar layer.

18. The method of claim 17, wherein the step of forming an electrochemical structure includes:
   forming a copper layer on a surface of the substrate;
   electrically coupling the copper layer to the positive terminal of the pulse power supply;
   forming a resistance $R_1$ within the electrical coupling between the copper layer and the positive terminal of the pulse power supply; and
   forming a resistance $R_2$ within the electrical coupling between the CIC laminate and the positive terminal of the pulse power supply.

19. The method of claim 18, further comprising adjusting $R_1$ and $R_2$ such that $t_1$, $t_2$, and $t_3$ are about equal to one another.

20. The method of claim 17, wherein the providing step includes providing a copper anode, and wherein the step of forming an electrochemical structure includes:

immersing the copper anode in the acid solution;
electrically coupling the copper anode to the positive terminal of the pulse power supply;
forming a resistance $R_1$ within the electrical coupling between the copper anode and the positive terminal of the pulse power supply; and
forming a resistance $R_2$ within the electrical coupling between the CIC laminate and the positive terminal of the pulse power supply.

21. The method of claim 20, further comprising adjusting $R_1$ and $R_2$ such that $t_1$, $t_2$, and $t_3$ are about equal to one another.

22. An electrochemical structure, comprising:
a tank holding an acid solution;
a pulse power supply generating a periodic voltage, wherein a period of the periodic voltage includes a pulse voltage for a first time interval followed by a zero voltage for a second time interval;
a conductive cathode immersed in the acid solution, wherein the conductive cathode is electrically coupled to a negative terminal of the pulse power supply; and
a dielectric substrate immersed in the acid solution, said substrate including:
a copper-Invar-copper (CIC) laminate having an Invar layer sandwiched between a first copper layer and a second copper layer, wherein the CIC laminate is electrically coupled to a positive terminal of the pulse power supply;
a through hole passing through the CIC laminate; and
a metal skin on a through-hole surface of the CIC laminate.

23. The electrochemical structure of claim 22, further comprising a transducer generating an ultrasonic power having a frequency.

24. The electrochemical structure of claim 23, wherein the ultrasonic power is between about 1 kw and about 10 kw, and wherein the frequency is between about 45 KHz and about 75 KHz.

25. The electrochemical structure of claim 22, wherein a diameter of the through hole is not greater than about 2 mils.

26. The electrochemical structure of claim 22, wherein the acid a solution includes phosphoric acid.

27. The electrochemical structure of claim 26, wherein a concentration of the phosphoric acid is between about 38% and about 55%.

28. The electrochemical structure of claim 22, wherein a temperature of the acid solution is between about 21° C. and about 35° C.

29. The electrochemical structure of claim 22, wherein the conductive cathode includes stainless steel.

30. The electrochemical structure of claim 22, wherein the pulse voltage is between about 1 volt and about 10 volts, wherein the first time interval is between about 5 milliseconds and about 20 milliseconds, and wherein the second time interval is between about 20 milliseconds and about 200 milliseconds.

31. The electrochemical structure of claim 22, further providing a second conductive cathode immersed in the acid solution and electrically coupled to the negative terminal of the pulse power supply.

32. The electrochemical structure of claim 22, further comprising a copper layer on a surface of the substrate, wherein the copper layer is electrically coupled to a positive terminal of the pulse power supply.

33. The electrochemical structure of claim 32,
wherein the electrical coupling of the copper layer to the pulse power supply includes a resistance $R_1$,
wherein the electrical coupling of the CIC laminate to the pulse power supply includes a resistance $R_2$, and
wherein $R_1$ and $R_2$ are such that the first copper layer, the Invar layer, and the second copper layer may be subsequently etched away at about the same etch rate.

34. The electrochemical structure of claim 22, further comprising a copper anode immersed in the acid solution, wherein the copper anode is electrically coupled to a positive terminal of the pulse power supply.

35. The electrochemical structure of claim 34,
wherein the electrical coupling of the copper anode to the pulse power supply includes a resistance $R_1$,
wherein the electrical coupling of the CIC laminate to the pulse power supply includes a resistance $R_2$, and
wherein $R_1$ and $R_2$ are such that the first copper layer, the Invar layer, and the second copper layer may be subsequently etched away at about the same etch rate.

36. A method for removing a metal skin from a metal structure, comprising the steps of:
providing a pulse power supply, a conductive cathode, an acid solution, and a dielectric substrate including:
the metal structure selected from the group consisting of a copper-Invar laminate, a nickel-iron alloy layer, and a laminate of a copper layer and a nickel-iron alloy layer;
a through hole passing through the metal structure; and
the metal skin on a through-hole surface of the metal structure;
forming an electrochemical structure, including:
immersing the transducer in the acid solution;
electrically coupling the transducer to the power supply;
electrically coupling the conductive cathode to a negative terminal of the pulse power supply;
immersing the metal structure in the acid solution;
electrically coupling the metal structure to a positive terminal of the pulse power supply;
turning on the pulse power supply and generating a periodic voltage, wherein a period of the periodic voltage includes a pulse voltage for a first time interval followed by a zero voltage for a second time interval; and
dissolving away the metal skin.

37. The method of claim 36, further providing a transducer and a power supply for the transducer, wherein the step of forming an electrochemical structure further includes:
immersing the conductive cathode in the acid solution; and
turning on the power supply, wherein the transducer generates an ultrasonic power having a frequency.

38. An electrochemical structure, comprising:
an acid solution;
a pulse power supply generating a periodic voltage, wherein a period of the periodic voltage includes a pulse voltage for a first time interval followed by a zero voltage for a second time interval;
a conductive cathode immersed in the acid solution, wherein the conductive cathode is electrically coupled to a negative terminal of the pulse power supply; and
a dielectric substrate immersed in the acid solution, wherein the substrate includes:
a metal structure selected from the group consisting of a copper-Invar laminate, a nickel-iron alloy layer, and a laminate of a copper layer and a nickel-iron alloy layer, wherein the metal structure is electrically coupled to a positive terminal of the pulse power supply;

a through hole passing through the metal structure; and a metal skin on a through-hole surface of the metal structure.

39. The electrochemical structure of claim 38, further including a transducer and a power supply for the transducer, wherein the step of forming an electrochemical structure further includes turning on the power supply, wherein the transducer generates an ultrasonic power having a frequency.

40. A method for etching an etchable laminate, comprising the steps of: providing:

a pulse power supply;

a conductive cathode;

an acid solution;

the etchable laminate including a first metallic layer in contact with a second metallic layer, wherein the first metallic layer includes a first metallic substance selected from the group consisting of a first metal and a first metal alloy, wherein the second metallic layer includes a second metallic substance selected from the group consisting of a second metal and a second metal alloy, and wherein an etch rate of the first metallic substance in the acid solution exceeds an etch rate of the second metallic substance in the acid solution; and a metallic anode including the first metallic substance;

creating an electrochemical structure, including:

immersing the conductive cathode in the acid solution;

electrically coupling the conductive cathode to a negative terminal of the pulse power supply;

immersing the etchable laminate in the acid solution;

electrically coupling the etchable laminate to a positive terminal of the pulse power supply;

placing the metallic anode in contact with the acid solution;

electrically coupling the metallic anode to the positive terminal of the pulse power supply;

forming a resistance $R_1$ within the electrical coupling between the metallic anode and the positive terminal of the pulse power supply; and forming a resistance $R_2$ within the electrical coupling between the etchable laminate and the positive terminal of the pulse power supply; and turning on the pulse power supply and generating a periodic voltage, wherein a period of the periodic voltage includes a pulse voltage for a first time interval followed by a zero voltage for a second time interval;

etching away a thickness ($t_1$) of the first metallic layer; and etching away a thickness ($t_2$) of the second metallic layer.

41. The method of claim 40, further comprising adjusting $R_1$ and $R_2$ such that $t_1$ is about equal to $t_2$.

42. The method of claim 40, further comprising adjusting $R_1$ and $R_2$ such that $t_1$ is less than $t_2$.

43. An electrochemical structure, comprising:

a tank holding an acid solution;

a pulse power supply generating a periodic voltage, wherein a period of the periodic voltage includes a pulse voltage for a first time interval followed by a zero voltage for a second time interval;

a conductive cathode immersed in the acid solution and electrically coupled to a negative terminal of the pulse power supply; and an etchable laminate immersed in the acid solution and electrically coupled by a resistance $R_1$ to a positive terminal of the pulse power supply, said etchable laminate including:

a first metallic layer having a first metallic substance selected from the group consisting of a first metal and a first metal alloy; and a second metallic layer in contact with the first metallic layer, said second metallic layer having a second metallic substance selected from the group consisting of a second metal and a second metal alloy, wherein an etch rate of the first metallic substance in the acid solution exceeds an etch rate of the second metallic substance in the acid solution; and a metallic anode in contact with the acid solution and electrically coupled by a resistance $R_2$ to the positive terminal of the pulse power supply, said metallic anode including the first metallic substance.

44. The electrochemical structure of claim 43, wherein $R_1$ and $R_2$ are such that the first metallic layer and the second metallic layer may be subsequently etched away at about the same rate.

45. The electrochemical structure of claim 43, wherein $R_1$ and $R_2$ are such that the first metallic layer my be subsequently etched more slowly than the second metallic layer.

* * * * *